(12) United States Patent
Zhou et al.

(10) Patent No.: US 8,604,147 B2
(45) Date of Patent: Dec. 10, 2013

(54) PORPHYRIN COPOLYMER CONTAINING QUINOXALINE UNIT, PREPARATION METHOD AND USES THEREOF

(75) Inventors: Mingjie Zhou, Guangdong (CN); Jie Huang, Guangdong (CN); Yijin Liu, Guangdong (CN)

(73) Assignee: Ocean's King Lighting Science & Technology Co., Ltd., Guangdong (CN)

( * ) Notice: Subject to any disclaimer, the term of this patent is extended or adjusted under 35 U.S.C. 154(b) by 0 days.

(21) Appl. No.: 13/696,433

(22) PCT Filed: May 18, 2010

(86) PCT No.: PCT/CN2010/072864
§ 371 (c)(1),
(2), (4) Date: Nov. 6, 2012

(87) PCT Pub. No.: WO2011/143806
PCT Pub. Date: Nov. 24, 2011

(65) Prior Publication Data
US 2013/0059994 A1 Mar. 7, 2013

(51) Int. Cl.
*C08G 65/38* (2006.01)
(52) U.S. Cl.
USPC ............ 526/216; 528/94; 528/117; 528/118; 528/54; 528/62; 528/64; 526/239; 526/171
(58) Field of Classification Search
USPC ................ 528/216, 94, 117, 118, 54, 62, 64; 526/239, 171
See application file for complete search history.

(56) References Cited

U.S. PATENT DOCUMENTS 6,437,067 B1 8/2002 Asano et al.
2009/0314660 A1 12/2009 Canonne et al.

FOREIGN PATENT DOCUMENTS

EP 1 772 730 A1 4/2007

OTHER PUBLICATIONS

Li et al. (Macromolecules 2006, 39, 456-461).*
International Search Report for corresponding International Application No. PCT/CN2010/072864 mailed Feb. 24, 2011.
Zhu et al., "Study on Photoconduction Properties of Polyimide Films Containing Tetraphenylporphyrin Units", Journal of Functional Polymers, vol. 16, No. 2, 2003, pp. 142-148 (English translation of Abstract).
Zhao et al., "Synthesis and photocurrent response to porphyrin-containing conjugated polymers", Chinese Science Bulletin, vol. 51, No. 11, 2006, pp. 1287-1295.

* cited by examiner

*Primary Examiner* — Shane Fang
(74) *Attorney, Agent, or Firm* — Renner, Otto, Boisselle & Sklar, LLP (57) ABSTRACT

A porphyrin copolymer containing quinoxaline unit, preparation method and uses thereof are disclosed. The copolymer has the structural formula (I), wherein $R_1$, $R_2$, $R_3$, $R_4$ are selected from $C_1$~$C_{32}$ alkyl groups, and n is an integer between 1 and 100. The copolymer is useful in the fields of solar battery and the like.

13 Claims, 2 Drawing Sheets

PORPHYRIN COPOLYMER CONTAINING QUINOXALINE UNIT, PREPARATION METHOD AND USES THEREOF

This application is a national phase of International Application No. PCT/CN2010/072864 filed May 18, 2010.

FIELD OF THE INVENTION

The present invention relates to the technical field of synthesis of organic compounds, particularly to a porphyrin copolymer containing quinoxaline unit, and preparation method and uses thereof.

BACKGROUND OF THE INVENTION

Today's world economy is built on the basis of fossil energy, such as coal, petroleum and natural gas. However, these non-renewable fossil energy sources are running out continuously. Since the beginning of the $21^{st}$ century, global energy problems and the associated problems like environmental pollution and climate warming have become more apparent and severer. Solar energy has the prominent advantages such as wide distribution, abundance, pollution-free, cleanliness, safety, and easy accessibility, and is therefore considered to be one of the most promising renewable energy sources. Solar cells convert sunlight directly to electrical energy, and are practical and effective means to utilize solar energy. However, the commercialized solar cells so far are still limited to silicon based inorganic solar cells, of which the price is so high that it exceeds the generally acceptable level, which greatly limits the range of their applications. In order to reduce the cost of cells and to broaden the range of applications thereof, people have long been looking for novel materials for solar cells.

Organic solar cells are novel solar cells. Comparing with inorganic semiconductor materials which has the disadvantages such as limited sources, high price, toxicity, complicated preparation process, and high cost, organic solar cells possess certain incomparable advantages such as wide range of sources of materials, structural diversity and adaptability, low cost, safety and environmental friendliness, simple production process, light weight and possibility for large area flexible preparation. Therefore, organic solar cells can be widely used in a variety of areas like construction, lighting and power generation, and possess an important development and application prospect. In this connection, many domestic and foreign research institutions and enterprises have paid considerable attention and investment. However, so far, the photoelectric transformation efficiency of organic solar cells is still much lower than that of inorganic solar cells. Therefore, the development of novel organic semiconductor materials has great significance for improving the efficiency of organic solar cells.

Currently, the application of silicon cells for ground use is limited due to its complicated production process and high cost. In order to reduce the cost of the cells and to increase the range of applications thereof, people have long been looking for novel material for solar cells. Organic semiconductor materials have drawn great interest due to their advantages of readily availability of materials, low cost, simple preparation process, good environmental stability and good photovoltaic effect. Since 1992 when N. S. Sariciftci et. al. reported in SCIENCE the phenomena of photo-induced electron transfer between a conjugated polymer and $C_{60}$, lots of efforts have been made in the research of polymer solar cells, and a rapid development had been obtained. However, the conversion efficiency of organic solar cells is still much lower than that of inorganic solar cells. The constraint factors that limit the improvement of the performance include: mismatch of the spectral response of an organic semiconductor materials with the solar radiation spectrum, and the relatively low migration rate and electrode collection rate of the charge carrier of organic semiconductor materials. In order to practically use polymer solar cells, developing novel materials and significantly improving their energy conversion efficiency are still the primary task in this research area.

DISCLOSURE OF THE INVENTION

An object of the present invention is to overcome the above-mentioned deficiencies in the prior art by providing a porphyrin copolymer containing quinoxaline unit. Said copolymer has good electron buffering properties, good photo-electric and -magnetic properties, high flexibility, relatively good thermal stability, environmental stability, solubility and film-forming properties.

Another object of the present invention is to provide a method for preparing a porphyrin copolymer containing quinoxaline unit, which has the advantages of simple process, moderate reaction conditions, high yield, and ease in operation and control.

A further object of the present invention is to provide use of said porphyrin copolymer containing quinoxaline unit in the areas of organic photo-electric materials, polymer solar cells, organic electroluminescent devices, organic field effect transistors, organic optical storage materials, organic nonlinear materials and/or organic lasers.

To achieve the above-mentioned objects, the following technical solutions of the present invention are provided:

Provided herein is a porphyrin copolymer containing quinoxaline unit, which is represented by the following structural formula (I):

wherein $R_1$, $R_2$, $R_3$, $R_4$ are selected from $C_1$~$C_{32}$ alkyl groups; and n is an integer between 1 and 100.

Also provided herein is a method for preparing a porphyrin copolymer containing quinoxaline unit, said method comprising the following steps:

providing compounds A and B represented by the following structural formulas, respectively,

A

B wherein $R_1$, $R_2$, $R_3$, $R_4$ are selected from $C_1$-$C_{32}$ alkyl groups;

conducting Stille coupling reaction of compounds A and B in their stoichiometric ratio in the presence of a catalyst and an organic solvent under an oxygen-free environment to give a porphyrin copolymer containing quinoxaline unit of structural formula (I) wherein n is an integer between 1 and 100, (I)

Further provided herein is use of the porphyrin copolymer containing quinoxaline unit of the present invention in the areas of organic photo-electric materials, polymer solar cells, organic electroluminescent devices, organic field effect transistors, organic optical storage materials, organic nonlinear materials and/or organic lasers.

Comparing with the prior art, the porphyrin copolymer containing quinoxaline unit of the present invention possesses at least the following advantages.

1. The porphyrin contained in said copolymer is a single bond and double bond alternated planar macrocyclic delocalized π electron conjugated system bridged by four pyrrole rings and four methine groups, such that it exhibits high quantum efficiency of charge transfer and energy transfer, and hence good electron buffering properties, good photo-electric and -magnetic properties, high flexibility, and relatively good thermal and environmental stability.

2. The quinoxaline unit contained in the copolymer is a kind of electron-deficient aromatic unit, which is an excellent acceptor unit having a strong electron drawing ability, such that the copolymer possesses good electron transferring property and glass transition temperature, excellent electrochemical reducing property, etc. Furthermore, the quinoxaline unit has relatively high modifiability. Accordingly, electron donating groups and electron accepting groups can be incorporated into the copolymer by simple methods to adjust its electron drawing property.

3. By incorporating heterocyclic molecules, polyaromatic molecules and aromatic heterocyclic molecules into the copolymer, the density of the electron cloud of the skeleton is increased. The electron donor and electron acceptor alternated system narrows the bandgap of the copolymer, and increases its application values in the field of organic semiconductor materials.

4. By incorporating long-chain alkyl groups into the copolymer, the solubility and film-forming ability of the material are increased, thereby broadening the range of applications of porphyrin copolymer containing quinoxaline unit in the areas of organic photo-electric materials, polymer solar cells, organic electroluminescent devices, organic field effect transistors, organic optical storage materials, organic nonlinear materials and/or organic lasers.

5. The method for preparing the copolymer has the advantages of simple process, high yield, moderate reaction conditions and ease in operation and control, and is suitable for industrialized production.

PREFERRED EMBODIMENTS OF THE PRESENT INVENTION

In order to make the technical problems to be solved, the technical solutions and the beneficial effects of the invention more apparent, the present invention will be further described referring to the drawings and Examples. It should be understood that the embodiments described herein are merely illustration of the invention and shall not be construed to limit the invention.

Figure 1:
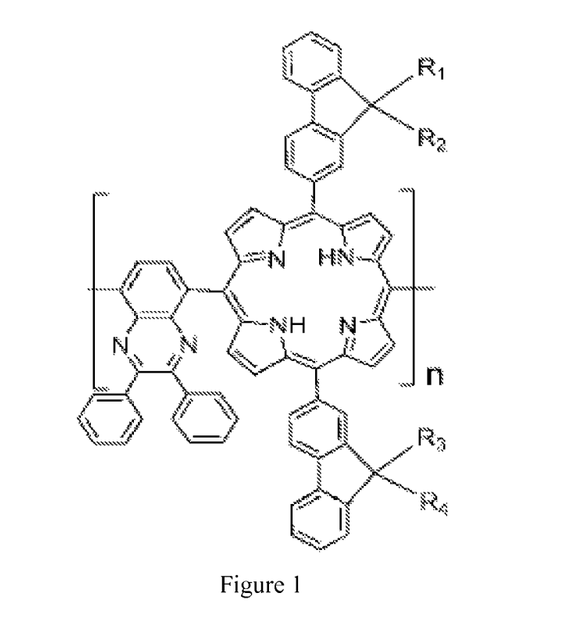
FIG. 1 shows the structural formula of the porphyrin copolymer containing quinoxaline unit of the Examples of the present invention.

Referring to FIG. 1, which shows a porphyrin copolymer containing quinoxaline unit of the Examples of the present invention, said copolymer has the following structural formula (I):

(I)

wherein $R_1$, $R_2$, $R_3$, $R_4$ are selected from $C_1$~$C_{32}$ alkyl groups; and n is an integer between 1 and 100, and wherein $R_1$, $R_2$, $R_3$, $R_4$ are preferably $C_1$~$C_{16}$ alkyl groups, such as —$CH_3$, —$C_8H_{17}$, —$C_{10}H_{21}$, —$C_{16}H_{33}$, —$C_{32}H_{65}$ and the like.

Porphyrin is the general term for a group of macrocyclic compounds having substituents on the porphyrin ring. In the Examples of the present invention, the porphyrin contained in the copolymer is a single bond and double bond alternated planar macrocyclic delocalized π electron conjugated system bridged by four pyrrole rings and four methine groups, such that it exhibits high quantum efficiency in charge transfer and energy transfer reactions, and good electron buffering properties, good photo-electric and -magnetic properties, high flexibility, and relatively good thermal and environmental stability. In this connection, the porphyrin copolymer containing quinoxaline unit of the Examples is a kind of promising organic semiconductor material which can be used in the area of photovoltaics.

The quinoxaline unit contained in the copolymer is a kind of electron-deficient aromatic unit, which is an excellent acceptor unit having a strong electron drawing ability, such that the copolymer possesses good electron transferring property and glass transition temperature, excellent electrochemical reducing property, etc. Furthermore, the quinoxaline unit has relatively high modifiability. Accordingly, electron donating groups and electron accepting groups can be incorporated into the copolymer by simple methods to adjust its electron drawing property. Therefore, the copolymer of the Examples can also be used in photo-electric materials.

The copolymer of the Examples also contains a fluorenyl group. The density of the electron cloud of the copolymer skeleton is effectively increased by incorporating heterocycle into the copolymer of the Examples and using electron donor and electron acceptor alternated system, thereby narrowing the bandgap of the copolymer of the present example, and increasing its potential application value in the area of organic semiconductor materials.

By incorporating long-chain alkyl groups into the copolymer, the solubility and film-forming ability of the material are increased, thereby broadening the range of applications of porphyrin copolymer containing quinoxaline unit in the areas of organic photo-electric materials, polymer solar cells, organic electroluminescent devices, organic field effect transistors, organic optical storage materials, organic nonlinear materials and/or organic lasers.

Additionally, the Examples of the present invention provide a method for preparing said porphyrin copolymer containing quinoxaline unit, which comprises the following steps:

providing compounds A and B represented by the following structural formulas, respectively,

(I)

The reaction scheme of said Stille coupling reaction is shown as follows:

B

A wherein $R_1$, $R_2$, $R_3$, $R_4$ are selected from $C_1$-$C_{32}$ alkyl groups;

conducting Stille coupling reaction of compounds A and B in their stoichiometric ratio in the presence of a catalyst and an organic solvent under an oxygen-free environment to give a porphyrin copolymer containing quinoxaline unit of structural formula (I) wherein n is an integer between 1 and 100, The method for preparing compound A comprises the following steps:

conducting condensation reaction of 9,9-dialkyl-2-formylfluorene and dipyrrolylmethane in their stoichiometric ratio in the presence of a catalyst and an organic solvent to give a 5,15-di(9,9-dialkylfluorenyl)porphyrin based compound;

conducting bromination reaction of the 5,15-di(9,9-dialkylfluorenyl)porphyrin based compound and N-bromobutanimide in their stoichiometric ratio in the presence of an organic solvent to give compound A.

In the above method for preparing compound A, the catalyst used in the condensation reaction is preferably one or more of trifluoroacetic acid, propionic acid and acetic acid, which may be added in an amount of 0.1~10 ml (the actual amount in conducting the experiments); and the organic solvent is preferably one or more of dichloromethane, trichloromethane, tetrahydrofuran. The reaction temperature of the condensation reaction is preferably 20~100° C., and the reaction time is preferably 1~24 hours.

In the method for preparing compound A, the organic solvent used in the bromination reaction is preferably chloroform, tetrahydrofuran (THF), dimethylformamide (DMF) or o-dichlorobenzene. The reaction temperature of the bromination reaction is preferably 0~120° C., and the reaction time is preferably 1~72 hours. In order to increase the yield of compound A, a base may also be added. The acid generated upon the generation of compound A during the bromination reaction increases the pH of the reaction system, which inhibits the reaction rate of the forward reaction, and lowers the yield of compound A. Accordingly, an appropriate amount of a base is added to lower the pH value of the reaction system. The added base is preferably, but not limited to, pyrrole, of which the addition amount may be 0.1~10 ml.

In the method for preparing compound A, the condensation reaction and/or bromination reaction may be conducted in the presence or absence of oxygen. Preferably, the condensation reaction and/or bromination reaction are conducted in an oxygen-free environment, which can be achieved by using vacuum or filling with an inert gas, preferably by filling with an inert gas. The inert gas may be an inert gas commonly used in the art, such as nitrogen, argon, or the like, preferably nitrogen. Conducting the reaction in an oxygen-free environment can improve the product the yield of each reaction step since oxygen is an active ingredient which may react with the reactants and interrupt the reaction, and thereby lower the yield of the products.

Compound B may be prepared by conventional methods commonly employed in the art, such as the preparation method of step 1 and step 2 of Example 1. Other compounds involved in the present method are all prepared by conventional methods commonly employed in the art. For example, 9,9-dialkyl-2-bromofluorene is prepared from 2-bromofluorene and corresponding bromoalkane in the presence of a catalyst/solvent; 9,9-dialkyl-2-formylfluorene is prepared from 9,9-dialkyl-2-bromofluorene in a system of n-butyl lithium/dimethylformamide/tetrahydrofuran; and dipyrrolylmethane is prepared from formaldehyde and pyrrole in the presence of a catalyst.

In the above Stille coupling reaction, the reaction temperature is preferably 50~120° C., the reaction time is preferably 24~72 hours, the catalyst is preferably at least one of a mixture of an organopalladium and an organophosphine ligand, $Pd(PPh_3)_4$, $Pd_2(dba)_3$ and $Pd(PPh_3)_2Cl_2$, and the organic solvent is preferably at least one of tetrahydrofuran, ethylene glycol dimethyl ether, benzene or toluene. Furthermore, the catalyst is used in an amount of 0.05 mol %~20 mol % based on the molar amount of compound B. As a mixture of an organopalladium and an organophosphine ligand is used as the catalyst, the molar ratio of the organopalladium to the organophosphine ligand is 1:2~20. The Stille coupling reaction requires a catalyst to be involved, in which the catalyst reacts with one of the reactants to generate an intermediate that renders the reaction to complete.

In the method for preparing a porphyrin copolymer containing quinoxaline unit, it is only needed to add the reactants in a required specific ratio without special requirements on the equipments and environmental conditions. Furthermore, the preparation method has the advantages of simple process, moderate reaction conditions, high yield and ease in operation, and is suitable for industrialized production.

In view of the advantages as set forth above, the porphyrin copolymer containing quinoxaline unit can be applied in the areas of organic photo-electric materials, polymer solar cells, organic electroluminescent devices, organic field effect transistors, organic optical storage materials, organic nonlinear materials and/or organic lasers.

The present invention will be described below in further details referring to the Examples.

Example 1

Preparation of a Porphyrin Copolymer Containing Quinoxaline Unit Represented by the Following Structural Formula I₁

(I)

1) Preparation of 5,8-dibromo-2,3-bis(phenyl)quinoxaline According to the Following Reaction Scheme Preparation procedure: 3,6-dibromo-o-phenylene diamine (1.0 g, 3.7 mmol) is added to an acetic acid (20 mL) solution of benzil (0.39 g, 1.84 mmol) at 120° C. The resulting solution is mixed homogeneously and reflux for 12 hours. The reaction solution is poured into water, neutralized with sodium bicarbonate, extracted with chloroform, washed with saturated brine water, and dried over anhydrous sodium sulfate. The solvents are removed using a rotary evaporator. The crude product is subjected to column chromatography to give a white solid, which is then recrystallized in chloroform/n-hexane to afford a white solid powder (yield 86%), MALDI-TOF-MS (m/z): 440.1 (M⁺).

2) Preparation of 5,8-di(tributyltin)-2,3-bis(phenyl)quinoxaline According to the Following Reaction Scheme Preparation procedure: to a 500 mL three-necked flask are added 5,8-dibromo-2,3-bis(phenyl)quinoxaline (1.3 g) and 400 mL of tetrahydrofuran. The reaction is cooled to −30° C., followed by adding dropwise 2.5 mL (2.5 M) of n-butyl lithium. After reacting at −30° C. for an hour, SnBu₃Cl (2.0 g) is added in one portion. The reaction is continued at −30° C. for 30 min. After warming to room temperature, the reaction mixture is stirred for 20 hours. The reaction mixture is then poured into ice water, extracted with diethyl ether, dried over anhydrous magnesium sulfate, and distilled under reduced pressure to remove the solvents. The residue is purified with column chromatography (silica gel/petroleum ether, at 30~60° C.) to give the product (yield: 80%, MALDI-TOF-MS (m/z): 860.4 (M⁺).

3) Preparation of 10,20-di(9,9-dioctylfluorenyl)porphyrin According to the Following Reaction Scheme

4) Preparation of 5,15-dibromo-10,20-di(9,9-dioctylfluorenyl)porphyrin According to the Following Reaction Scheme Preparation procedure: an oxygen-free and water-free apparatus is set-up. The intermediates, 9,9-dioctyl-2-formylfluorene (0.420 g), and dipyrrolylmethane (0.15 g) are weighed and dissolved in dichloromethane (60 mL). The reaction system is bubbled with nitrogen for 30 minutes, and added with trifluoroacetic acid (1 ml) by means of a syringe. After stirring at room temperature for 24 hours, dichlorodicyanobenzoquinone (DDQ) (0.91 g) is added, the reaction mixture is stirred for additional 30 minutes at room temperature. The reaction is then quenched by adding triethylamine (1 ml), which is then concentrated to remove the solvents, and filtrated. The filtrate is collected, and the solvents are removed using a rotary evaporator. The residue is quickly rinsed with dichloromethane on a silica gel column. The solvent is removed with a rotary evaporator. The residue is recrystallized in acetic acid/methanol to give the product (yield: ~75%, MALDI-TOF-MS (m/z): 1087.6 (M$^+$)).

Preparation procedure: an oxygen-free and water-free apparatus is set-up. 5,15-di(9,9-dioctylfluorenyl)porphyrin (0.22 g) is weighed and dissolved in o-dichlorobenzene (70 mL). 0.1 mL of pyridine is then added. The reaction system is cooled to 0° C., followed by adding N-bromobutanimide (0.71 g). After stirring for 0.5 hours, the mixture is allowed to warm up to room temperature, and kept stirring for another 4 hours. The reaction is quenched by adding acetone. The solvents are removed, and the crude product is recrystallized in acetic acid/methanol to give the product (yield: 86%, MALDI-TOF-MS (m/z): 1165.5 (M$^+$)).

5) Preparation of the Porphyrin Copolymer Containing Quinoxaline Unit I₁ According to the Following Reaction Scheme Preparation procedure: 5,8-di(tributyltin)-2,3-bis(phenyl)quinoxaline (0.17 g) and 5,15-dibromo-10,20-di(9,9-dioctylfluorenyl)porphyrin (0.25 g) are weighed and dissolved in toluene (80 ml) under nitrogen protection. The reaction system is vacuumized to remove oxygen and flushed with nitrogen, followed by adding 0.5 mol % of Pd(PPh₃)₂Cl₂ based on the molar amount of 5,8-di(tributyltin)-2,3-bis(phenyl)quinoxaline, heating to 100° C. and reacting for 48 hours. After completion of the reaction, the reaction system is cooled down to room temperature. The mixture is added dropwise into methanol to give a precipitate, which is filtered, washed with methanol, dried, and dissolved in toluene. The resulted solution is added to an aqueous solution of sodium diethyldithio carbamate, heated to 80° C., and stirred for 15 hours. After that, the organic phase is subjected to column chromatography on alumina, and washed with chlorobenzene. The organic solvents are removed under reduced pressure, followed by precipitation in methanol. The precipitate is suction filtrated to give a solid. The obtained solid is extracted with acetone in a Soxhlet extractor for 72 hours. The resultant mixture is subjected to methanol precipitation and suction filtration to give the product with the molecular weight (GPC, THF, R. I) of: Mn=38400, Mw/Mn=3.3.

Example 2

Preparation of a Porphyrin Copolymer Containing Quinoxaline Unit Represented by the Following Structural Formula I₂

1) Preparation of 10-(9-methyl-9-octylfluorenyl)-20-(9-decyl-9-hexadecylfluorenyl)porphyrin According to the Following Reaction Scheme

2) Preparation of 5,15-dibromo-10-(9-methyl-9-octylfluorenyl)-20-(9-decyl-9-hexadecylfluorenyl)porphyrin According to the Following Reaction Scheme Preparation procedure: The intermediates, 9-methyl-9-octylfluorene (0.320 g), 9-decyl-9-hexadecylfluorene (0.56 g), dipyrrolylmethane (0.30 g) as shown in the above reaction scheme are weighed in a molar equivalent ratio of a/b/d=1/1/2, and dissolved in tetrahydrofuran (650 mL). Acetic acid (2 ml) is added using a syringe. The reaction mixture is stirred at 100° C. for 3 hours. After adding 1.82 g of dichlorodicyanobenzoquinone (DDQ), the reaction is stirred at 100° C. for additional 30 minutes. The reaction is quenched by adding triethylamine (2 ml), concentrated and filtered. The filtrate is collected and the solvents are removed with a rotary evaporator. The residue is washed quickly with dichloromethane on a silica gel column. The solvent is removed using a rotary evaporator, and the residue is recrystallized in acetic acid/methanol to give the product (yield: 71%, MALDI-TOF-MS (m/z): 1129.7 ($M^+$)).

Preparation procedure: 5-(9-methyl-9-octylfluorenyl)-15-(9-decyl-9-hexadecylfluorenyl)porphyrin (0.23 g) is weighed and dissolved in a mixed solution of dimethylamide and chloroform (60 mL, 1:3, v/v). Pyridine (10 mL) is added and the reaction system is heated to 120° C., followed by adding N-bromobutanimide (0.73 g). After stirring for 0.5 hours, the mixture is allowed to return to room temperature, and stirred for additional 4 hours. Acetone is added to quench the reaction. The solvents are removed, and the residue is recrystallized in acetic acid/methanol to give the product (yield: 81%, MALDI-TOF-MS (m/z): 1127.7 ($M^+$)).

3) Preparation of a Porphyrin Copolymer Containing Quinoxaline Unit I₂ According to the Following Reaction Scheme Preparation procedure: 5,8-di(tributyltin)-2,3-bis(phenyl)quinoxaline (0.17 g) prepared according to step 1) and step 2)

of Example 1, 5,15-dibromo-10-(9-methyl-9-octylfluorenyl)-20-(9-decyl-9-hexadecylfluorenyl)porphyrin (0.25 g) and tetrahydrofuran (80 ml) are added under nitrogen protection. The reaction system is vacuumized to remove oxygen and flushed with nitrogen, followed by adding 20 mol % of a mixture of $Pd_2(dba)_3$ and $P(o\text{-}Tol)_3$ (1:1, by mole) based on the molar amount of 5,8-di(tributyltin)-2,3-bis(phenyl)quinoxaline, heating to 52° C. and reacting for 72 hours. After completion of the reaction, the reaction system is cooled down to room temperature. The mixture is added dropwise into methanol to give a precipitate, which is filtered, washed with methanol, dried, and dissolved in toluene. The resulted solution is added to an aqueous solution of sodium diethyldithio carbamate, heated to 80° C., and stirred for 12 hours. After that, the solution is allowed to settle down for phase separation. The organic phase is subjected to column chromatography on alumina, and washed with chlorobenzene. The organic solvents are removed under reduced pressure, followed by precipitation in methanol. The precipitate is suction filtrated to give a solid. The obtained solid is extracted with acetone in a Soxhlet extractor for 72 hours. The resulted mixture is subjected to methanol precipitation and 15 hour suction filtration to give the product with the molecular weight (GPC, THF, R. I) of: Mn=46100, Mw/Mn=3.1.

Example 3

Preparation of a Porphyrin Copolymer Containing Quinoxaline Unit Represented by the Following Structural Formula I₃

1) Preparation of 10-(9-methyl-9-dotriacontanylfluorenyl)-20-(9,9-dihexadecylfluorenyl)porphyrin According to the Following Reaction Scheme Preparation procedure: an oxygen-free and water-free apparatus is set-up. The intermediates, 9-methyl-9-dotriacontanylfluorene (0.320 g), 9-decyl-9-hexadecylfluorene (0.56 g), dipyrrolylmethane (0.30 g) as shown in the above reaction scheme are weighed in a molar equivalent ratio of a/b/d=1/1/2, and dissolved in trichloromethane (60 mL). The reaction system is flushed with nitrogen for 30 minutes, followed by adding trifluoroacetic acid (2 ml) using a syringe. The reaction mixture is stirred at room temperature for 3 hours. After adding 1.82 g of dichlorodicyanobenzoquinone, the reaction is stirred at room temperature for additional 30 minutes. The reaction is quenched by adding triethylamine (2 ml), concentrated and filtered. The filtrate is collected and the solvents are removed with a rotary evaporator. The residue is washed quickly with dichloromethane on a silica gel column. The solvent is removed using a rotary evaporator, and the residue is recrystallized in acetic acid/methanol to give the product (yield: 71%, MALDI-TOF-MS (m/z): 1129.7 (M$^+$)).

2) Preparation of 5,15-dibromo-10-(9-methyl-9-dotriacontanylfluorenyl)-20-(9,9-dihexadecylfluorenyl)porphyrin Preparation procedure: an oxygen-free and water-free apparatus is set-up. 10-(9-methyl-9-dotriacontanylfluorenyl)-20-(9,9-dihexadecylfluorenyl)porphyrin (0.23 g) is weighed and dissolved in tetrahydrofuran (70 mL). Pyridine (0.1 mL) is added and the reaction system is cooled down to 0° C., followed by adding N-bromobutanimide (0.73 g). After stirring for 0.5 hours, the mixture is allowed to return to room temperature, and stirred for additional 4 hours. Acetone is added to quench the reaction. The solvents are removed and the residue is recrystallized in acetic acid/methanol to give the product (yield: 81%, MALDI-TOF-MS (m/z): 1127.7 (M$^+$).

3) Preparation of a Porphyrin Copolymer Containing Quinoxaline Unit I$_3$ According to the Following Reaction Scheme -continued

I₃

Preparation procedure: 5,8-di(tributyltin)-2,3-bis(phenyl) quinoxaline (0.17 g) prepared according to step 1) and step 2) of Example 1, 5,15-dibromo-10-(9-methyl-9-dotriacontanylfluorenyl)-20-(9,9-dihexadecylfluorenyl)porphyrin (0.34 g) as well as a mixed solvent of toluene and ethylene glycol dimethyl ether (80 ml, 1:2, v/v) are added under nitrogen protection. The reaction system is vacuumized to remove oxygen and flushed with nitrogen, followed by adding 0.05 mol % of $Pd_2(dba)_3$ based on the molar amount of 5,8-di (tributyltin)-2,3-bis(phenyl)quinoxaline, heating to 120° C. and reacting for 52 hours. After completion of the reaction, the reaction system is cooled down to room temperature. The mixture is added dropwise into methanol to give a precipitate, which is filtered, washed with methanol, dried, and dissolved in toluene. The resulted solution is added to an aqueous solution of sodium diethyldithio carbamate, heated to 80° C., and stirred for 12 hours. After that, the solution is allowed to settle down for phase separation. The organic phase is subjected to column chromatography on alumina, and washed with chlorobenzene. The organic solvents are removed under reduced pressure, followed by precipitation in methanol. The precipiate is suction filtrated to give a solid. The obtained solid is extracted with acetone in a Soxhlet extractor for 72 hours. The resulted mixture is subjected to methanol precipitation and suction filtration to give the product with the molecular weight (GPC, THF, R. I) of: Mn=40800, Mw/Mn=3.4.

Application Example 4

Figure 2:
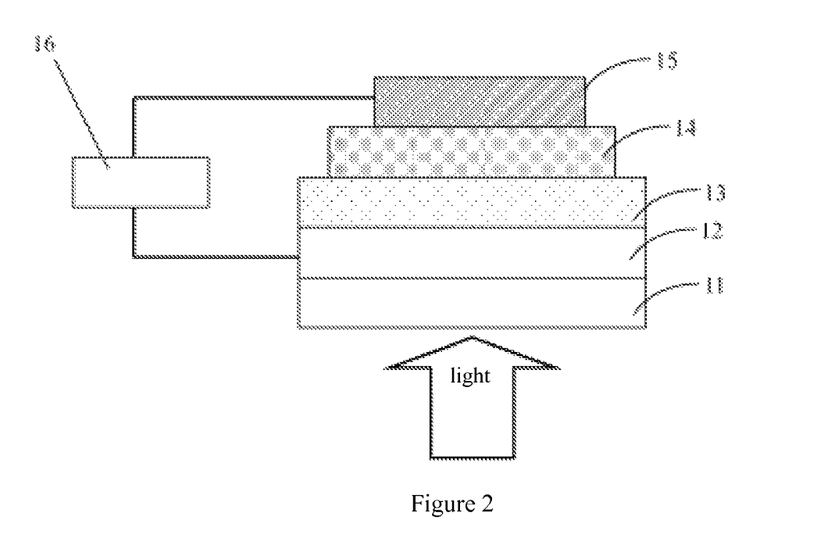
FIG. 2 is a structural diagram of an organic solar cell device using the porphyrin copolymer containing quinoxaline unit prepared in Example 1 as the active layer.

Preparation of a Solar Cell Device Using the Porphyrin Copolymer Containing Quinoxaline Unit Prepared in Example 1 as the Active Layer Referring to FIG. 2, the solar cell device comprises a glass substrate 11, a transparent anode 12, an intermediate assisting layer 13, an active layer 14 and a cathode 15, which are stacked in sequence, wherein the intermediate assisting layer 13 is comprised of polyethylenedioxythiophene:polystyrenesulfonate composite material (PEDOT:PSS), and the active layer 14 comprises an electron donor material and an electron acceptor material, in which the porphyrin copolymer containing quinoxaline unit prepared in Example 1 is used as the electron donor material while the electron acceptor material may be [6,6]phenyl-$C_{61}$-methylbutyrate (PCBM). Indium tin oxide (ITO), preferably indium tin oxide having a sheet resistance of 10-20 Ω/sq, may be used as the transparent anode 12. An aluminum electrode or a double-layer metal electrode, such as Ca/Al or Ba/Al, may be used as the cathode 15. In the solar cell device, the glass substrate 11 may be used as the substrate. In the manufacturing process, an ITO glass is selected, washed supersonically, and treated with oxygenplasma. Onto the ITO glass is coated an intermediate assisting layer 13. The porphyrin copolymer containing quinoxaline unit prepared in Example 1 and an electron acceptor material is blended and coated onto the intermediate assisting layer 13 to form the active layer 14. The cathode 15 is deposited onto the active layer 14 by vacuum deposition technology to produce the solar cell device. In a preferred example, the thicknesses of the transparent anode 12, the intermediate assisting layer 13, the active layer 14, and the double metallic Ca and Al layer are 170, 40, 120 and 80 nm, respectively.

As illustrated in FIG. 2, under light irradiation, the light passes through the glass substrate 11 and the ITO electrode 12. The porphyrin copolymer containing quinoxaline unit prepared in Example 1 contained in the active layer 14 absorbs the light energy to generate excitons which migrate to the interface of the electron donor/acceptor materials, and transfer the electrons to the electron acceptor material, such as PCBM, to achieve charge separation, forming free charge carriers, i.e. free electrons and holes. The free electrons migrate to the metal cathode along the electron acceptor material and are collected by the cathode, while the free holes migrate to the ITO anode along the electron donor material and are collected by the anode, thereby forming photocurrent and photovoltage, and achieving photoelectric conversion. When an external load 16 is connected, it can be powered by the device. In the above process, due to the broad spectral response range of the porphyrin copolymer containing quinoxaline unit prepared in Example 1, the copolymer can fully utilize the light energy, and obtain greater photoelectric conversion efficiency, and increase the electricity production performance of the solar cell device. Furthermore, this kind of organic material can reduce the mass of the solar cell device, and can be readily produced by technologies such as spin coating, which facilitates the large scale production.

Application Example 5

Preparation of an Organic Electroluminescent Device Containing the Porphyrin Copolymer Containing Quinoxaline Unit Prepared in Example 1

Figure 3:
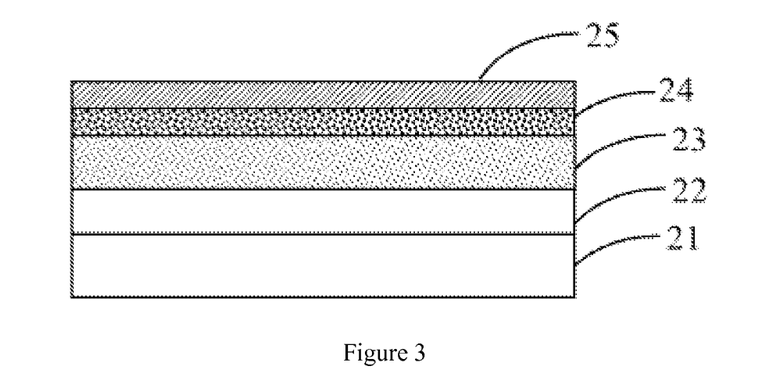
FIG. 3 is a structural diagram of an organic electroluminescent device using the porphyrin copolymer containing quinoxaline unit prepared in Example 1 as the light emitting layer.

Referring to FIG. 3, which shows an organic electroluminescent device that employs the porphyrin copolymer containing quinoxaline unit prepared in Example 1, the organic electroluminescent device comprises a glass substrate 21, a transparent anode 22, a light emitting layer 23, a buffer layer 24, a cathode 25, which are stacked in sequence, wherein indium tin oxide (ITO), preferably indium tin oxide having a sheet resistance of 10-20 Ω/sq, may be used for the transparent anode 22; the light emitting layer 23 comprises the porphyrin copolymer containing quinoxaline unit prepared in Example 1; the buffer layer 24 may comprise LiF but not limited thereto; and the cathode 25 may be, but not limited to, metallic Al and the like. Accordingly, in a specific embodiment, the structure of the organic electroluminescent device is expressed as follows: ITO/the porphyrin copolymer containing quinoxaline unit prepared in Example 1/LiF/Al. Each layer may be prepared by conventional methods in the art, while the porphyrin copolymer containing quinoxaline unit prepared in Example 1 can be formed on ITO by spin coating. The LiF buffer layer can be deposited on the light emitting layer by vacuum evaporation, and metallic Al can be deposited on the buffer layer by evaporation and be used as the cathode of the device.

Application Example 6

Preparation of an Organic Field Effect Transistor Containing the Porphyrin Copolymer Containing Quinoxaline Unit Prepared in Example 1

Figure 4:
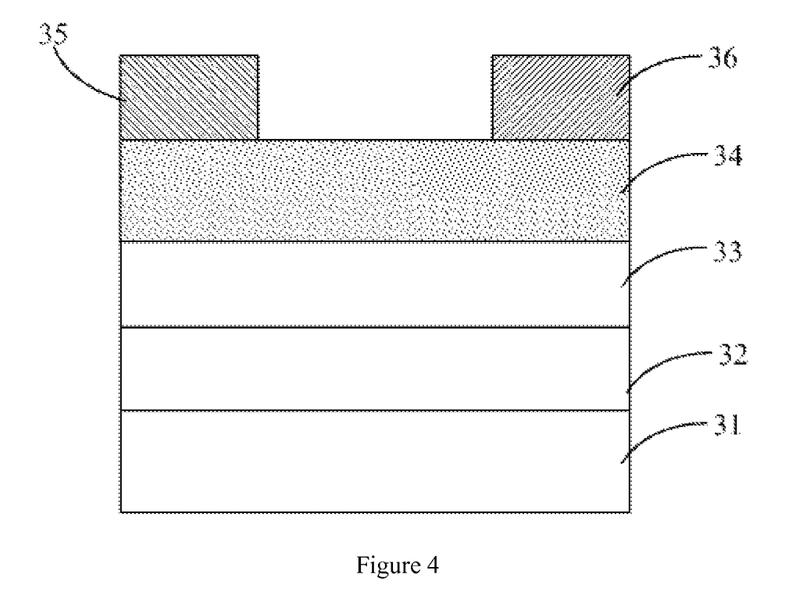
FIG. 4 is a structural diagram of an organic field effect transistor using the porphyrin copolymer containing quinoxaline unit prepared in Example 1 as the organic semiconductor layer.

Referring to FIG. 4, the organic field effect transistor comprises a substrate 31, an insulating layer 32, a modifying layer 33, an organic semiconductor layer 34 and a source electrode 35 and a drain electrode 36 provided on the organic semiconductor layer 34, which are stacked in sequence, wherein the substrate 31 may be, but not limited to, a highly doped silicon sheet (Si), and the insulating layer 32 may be, but not limited to, $SiO_2$ having a thickness in nanometer order (e.g. 450 nm). The porphyrin copolymer containing quinoxaline unit prepared in Example 1 is used as the organic semiconductor layer 34. The source electrode 35 and the drain electrode 36 may be, but not limited to, both gold. The modifying layer 33 may be, but not limited to octadecyltrichlorosilane (OTS). The substrate 31, the insulating layer 32, the modifying layer 33, the source electrode 35 and the drain electrode 36 can be prepared by conventional methods in the art. The organic semiconductor layer 34 may be formed by spin-coating the porphyrin copolymer containing quinoxaline unit prepared in Example 1 onto the insulating layer 32 which is modified by the modifying layer 33 at a vacuum level of about $10^{-4}$ Pa.

Described above are merely preferred embodiments of the present invention, and are not intended to limit the present invention. Any modification, equivalent replacement and improvement made without departing from the spirit and principle of the present invention shall be encompassed in the protection scope of the present invention.

What is claimed is:

1. A porphyrin copolymer containing quinoxaline unit represented by the following structural formula (I):

(I)

wherein $R_1$, $R_2$, $R_3$, $R_4$ are selected from $C_1$~$C_{32}$ alkyl groups; and n is an integer between 1 and 100.

2. The porphyrin copolymer containing quinoxaline unit according to claim 1, wherein $R_1$, $R_2$, $R_3$, $R_4$ are selected from $C_1$~$C_{16}$ alkyl groups.

3. A method for preparing a porphyrin copolymer containing quinoxaline unit, which comprises the following steps:
providing compounds A and B represented by the following structural formulas, respectively,

A

-continued

B wherein $R_1$, $R_2$, $R_3$, $R_4$ are selected from $C_1$-$C_{32}$ alkyl groups;

conducting Stille coupling reaction of compounds A and B in their stoichiometric ratio in the presence of a catalyst and an organic solvent under an oxygen-free environment to give a porphyrin copolymer containing quinoxaline unit of structural formula (I) wherein n is an integer between 1 and 100, (I)

4. The method for preparing a porphyrin copolymer containing quinoxaline unit according to claim 3, wherein the method for preparing said compound A comprises the following steps:

conducting condensation reaction of 9-$R_1$-9-$R_2$-2-formylfluorene, 9-$R_3$-9-$R_4$-2-formylfluorene and dipyrrolylmethane in their stoichiometric ratio in the presence of a catalyst and an organic solvent to give a 5-(9-$R_1$-9-$R_2$-fluorenyl)-15-(9-$R_3$-9-$R_4$-fluorenyl)porphyrin based compound;

conducting bromination reaction of the 5-(9-$R_1$-9-$R_2$-fluorenyl)-15-(9-$R_3$-9-$R_4$-fluorenyl)porphyrin based compound and N-bromobutanimide in their stoichiometric ratio in the presence of an organic solvent to give compound A.

5. The method for preparing a porphyrin copolymer containing quinoxaline unit according to claim 4, wherein said catalyst used in the condensation reaction is one or more of trifluoroacetic acid, propionic acid and acetic acid; said catalyst is used in an amount of 0.1~10 ml;

the reaction temperature of said condensation reaction is 20-100° C., and the reaction time is 1~24 hours.

6. The method for preparing a porphyrin copolymer containing quinoxaline unit according to claim 4, wherein the reaction temperature of said bromination reaction is 0~120° C., and the reaction time is 1~72 hours.

7. The method for preparing a porphyrin copolymer containing quinoxaline unit according to claim 4, wherein said condensation reaction and/or bromination reaction are conducted in an oxygen-free environment.

8. The method for preparing a porphyrin copolymer containing quinoxaline unit according to claim 3, wherein, in the Stille coupling reaction, the reaction temperature is 50~120° C., and the reaction time is 24~72 hours;

the catalyst is at least one of a mixture of an organopalladium and an organophosphine ligand, Pd(PPh$_3$)$_4$, Pd$_2$(dba)$_3$, Pd(PPh$_3$)$_2$Cl$_2$;

the organic solvent is at least one of tetrahydrofuran, ethylene glycol dimethyl ether, benzene or toluene.

9. The method for preparing a porphyrin copolymer containing quinoxaline unit according to claim 3, wherein the catalyst is used in an amount of 0.05 mol %-20 mol % based on the molar amount of compound B.

10. A polymer solar cell comprising the porphyrin copolymer containing quinoxaline unit according to claim 1.

11. The method for preparing a porphyrin copolymer containing quinoxaline unit according to claim 5, wherein said condensation reaction and/or bromination reaction are conducted in an oxygen-free environment.

12. The method for preparing a porphyrin copolymer containing quinoxaline unit according to claim 6, wherein said condensation reaction and/or bromination reaction are conducted in an oxygen-free environment.

13. The method for preparing a porphyrin copolymer containing quinoxaline unit according to claim 8, wherein the catalyst is used in an amount of 0.05 mol %-20 mol % based on the molar amount of compound B.

* * * * *